United States Patent
Feiweier et al.

(10) Patent No.: US 9,366,739 B2
(45) Date of Patent: Jun. 14, 2016

(54) ACTIVATING A MAGNETIC RESONANCE SYSTEM

(71) Applicants: Thorsten Feiweier, Poxdorf (DE); Thorsten Speckner, Erlangen (DE)

(72) Inventors: Thorsten Feiweier, Poxdorf (DE); Thorsten Speckner, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 503 days.

(21) Appl. No.: 13/853,865

(22) Filed: Mar. 29, 2013

(65) Prior Publication Data

US 2013/0257426 A1    Oct. 3, 2013

(30) Foreign Application Priority Data

Mar. 30, 2012 (DE) .................. 10 2012 205 294

(51) Int. Cl.
| | |
|---|---|
| *G01V 3/00* | (2006.01) |
| *G01R 33/54* | (2006.01) |
| *G01R 33/32* | (2006.01) |
| *G01R 33/561* | (2006.01) |

(52) U.S. Cl.
CPC ............ *G01R 33/54* (2013.01); *G01R 33/32* (2013.01); *G01R 33/5612* (2013.01)

(58) Field of Classification Search
CPC ....................................................... G01R 33/32
USPC ................................................. 324/322, 318
See application file for complete search history.

(56) References Cited

U.S. PATENT DOCUMENTS

| | | | |
|---|---|---|---|
| 6,969,992 B2 * | 11/2005 | Vaughan et al. ............ 324/318 |
| 7,622,921 B2 | 11/2009 | Fontius et al. | |
| 7,633,293 B2 * | 12/2009 | Olson et al. ................ 324/318 |
| 8,604,791 B2 * | 12/2013 | Vaughan et al. ............ 324/318 |
| 2001/0015644 A1 | 8/2001 | Schwilch et al. | |
| 2008/0122443 A1 | 5/2008 | Fontius et al. | |
| 2008/0211501 A1 | 9/2008 | Graesslin et al. | |
| 2010/0201365 A1 | 8/2010 | Bollenbeck | |
| 2011/0109315 A1 | 5/2011 | Biber et al. | |

FOREIGN PATENT DOCUMENTS

| | | |
|---|---|---|
| CN | 101166989 A | 4/2008 |
| CN | 102053233 A | 5/2011 |
| EP | 1130411 B1 | 3/2004 |
| WO | WO 2008/135878 | 11/2008 |

OTHER PUBLICATIONS

German Office Action dated Nov. 21, 2012 for corresponding German Patent Application No. DE 10 2012 205 294.1 with English translation.

(Continued)

*Primary Examiner* — Louis Arana
(74) *Attorney, Agent, or Firm* — Lempia Summerfield Katz LLC (57) ABSTRACT

A method for activating a magnetic resonance system having a transmit antenna arrangement is provided. The transmit antenna arrangement includes a plurality of independent high-frequency transmit channels with a respectively assigned transmit antenna. Each high-frequency transmit channel has a controllable oscillator. The individual high-frequency transmit channels are activated with independent transmit pulses, and a frequency of the controllable oscillators is controlled independently. At least two of the controllable oscillators therefore oscillate in different frequencies.

10 Claims, 3 Drawing Sheets

(56) References Cited

OTHER PUBLICATIONS

K. Setsompop et al, "Magnitude Least Squares Optimization for Parallel Radio Frequency Excitation Design Demonstrated at 7 Tesla With Eight Channels", Magnetic Resonance in Medicine 59, p. 908-915 (2008).

Chinese Office action for related Chinese Application No. 201310103246.7, dated Dec. 2, 2015, with English Translation.

* cited by examiner

ACTIVATING A MAGNETIC RESONANCE SYSTEM

This application claims the benefit of DE 10 2012 205 294.1, filed on Mar. 30, 2012, which is hereby incorporated by reference.

BACKGROUND

The present embodiments relate to activating a magnetic resonance system having a transmit antenna arrangement including a plurality of independent high-frequency transmit channels with a respectively assigned transmit antenna.

In a magnetic resonance tomography system (e.g., a magnetic resonance system), a body to be examined may be exposed, with the aid of a basic field magnet system, to a relatively powerful basic magnetic field (e.g., a $B_0$ field of 0.2 or 7 Tesla). A magnetic field gradient is also applied with the aid of a gradient system. A high-frequency transmit system is used to emit high-frequency excitation signals (HF signals) using suitable antenna devices, with the intention of tilting the nuclear spins of specific atoms excited in a resonant manner by the high-frequency field with spatial resolution through a defined flip angle in relation to the magnetic field lines of the basic magnetic field.

The high-frequency magnetic field emitted in the form of individual pulses or pulse trains is also referred to as the $B_1$ field. Such magnetic resonance excitation (MR excitation) by magnetic high-frequency pulses or the resulting flip angle distribution is also referred to in the following as nuclear magnetization or magnetization. As the nuclear spins relax, high-frequency signals (e.g., magnetic resonance signals) are emitted. The emitted high-frequency signals are received by suitable receive antennas and further processed. The desired image data may be reconstructed from the raw data acquired in this manner.

The emission of the high-frequency signals for nuclear spin magnetization may be effected using a whole body coil or body coil. A whole body coil may have the structure of a birdcage antenna including a number of transmit rods that are disposed, running parallel to the longitudinal axis, around a patient chamber of the tomography unit, in which a patient is accommodated during the examination. The antenna rods are connected capacitively to one another in a ring shape at ends of the antenna rods. Local coils in proximity to the body are increasingly used to emit MR excitation signals. The magnetic resonance signals may be received by the local coils. Alternatively or additionally, the magnetic resonance signals may be received by the body coil.

With more recent magnetic resonance systems, individual HF signals may be applied to individual transmit channels. A multichannel pulse that includes, as described above, a number of individual high-frequency pulses that may be emitted in a parallel manner via the different independent high-frequency transmit channels, is emitted. Such a multichannel pulse train (e.g., a pTX pulse because of the parallel emission of the individual pulses) may be used, for example, as an excitation, refocusing and/or inversion pulse. An antenna system having a number of independently activatable antenna components or transmit channels may also be referred to as a transmit array, regardless of whether the antenna system is a whole body antenna or an antenna arrangement close to the body.

Such pTX pulses or pulse trains made up of the pTX pulses may be determined beforehand for a specific planned measurement (e.g., the pulse shape and phase are determined). The pulses are to be emitted on the individual transmit channels with the specific planned measurement.

To plan the HF pulses, the user predefines a target magnetization (e.g., a desired flip angle distribution with spatial resolution) that is used as a setpoint value within the target function. The appropriate HF pulses for the individual channels are calculated so that the target magnetization is reached as far as possible. The basis for this is the Bloch equation $$\frac{dM}{dt} = \gamma \cdot M \times B \tag{1}$$

which describes the magnetization established by a magnetization vector M in a magnetic field B. $\gamma$ is the gyromagnetic ratio of the nucleus to be excited (e.g., for normally excited hydrogen, $\gamma$=42.58 MHz/T).

The pulse shape may be calculated such that a pulse of a specified length is discretized into a number of very short time steps. Time steps of 1 to 1000 μs duration may be used (e.g., a pulse of 10 to 20 ms includes more than 1000 time steps).

For small flip angles, the Bloch equation produces a linear equation system $$A \cdot b = m_{des} \tag{2}$$

where $m_{des}$ stands for the vector of the spatially discretized target magnetization, the vector b stands for the time discretization of the HF pulses, and A is a matrix including the linear relations resulting from the discretization of the linearized solution of the Bloch equations between the vector $m_{des}$ and the vector b. The solution of this equation system produces, for each of the time steps, a complex pulse value with a real and an imaginary part that represent the voltage amplitude and phase of the pulse for the activation of the magnetic resonance system.

The relationship between an HF pulse radiated in a resonant manner with field strength $B_1$ and the flip angle $\alpha$ thereby achieved is defined by the equation $$\alpha = \int_{t=0}^{\tau} \gamma \cdot B_1(t) \cdot dt \tag{3}$$

where $\gamma$ is the gyromagnetic ratio, and $\tau$ is the action period of the high-frequency pulse. The flip angle achieved by an emitted HF pulse and therefore the strength of the magnetic resonance signal are a function not only of the duration of the HF pulse, but also of the strength of the radiated $B_1$ field.

The multichannel transmit systems or transmit arrays set out above are also used, for example, to stamp (e.g., mark) a specified spatial distribution in amplitude and phase on the transverse magnetization after excitation. It is disadvantageous that with such selective transmission, the HF pulse becomes very long. Selective transmission refers, for example, to selective excitation. For example, the anatomical shape to be examined may be stamped. The liver or prostate, for example, may thus be excited or magnetized selectively, which may shorten the examination time significantly. In order to make the long HF pulse sufficiently short, the k-space may be traversed very quickly during transmission. Fast traversing of the k-space may be provided when the highest possible gradient amplitudes are used. High gradient amplitudes have the disadvantage that the high gradient amplitudes increase the required transmit bandwidth of the high-frequency signal. The transmit bandwidth $f_{BW}$ is calculated from the gradient G active during transmission and the extension D of the object, on which the desired magnetization is to be stamped, as:

$$f_{BW} = \frac{\gamma}{2\pi} \cdot G \cdot D \qquad (4)$$

If a magnetization is to be stamped, for example, with a gradient of 40 mT/m over a spatial region of the extension 500 mm, a bandwidth of approximately 850 kHz is used for $^1$H imaging.

Signal transmission components such as amplifiers and filters that allow a high transmission bandwidth and have high amplitude linearity permit phase-true transmission and are symmetrical with respect to amplitude and phase, are complex to manufacture and are correspondingly expensive. For example, the real-time regulators present in the transmit chain in modern magnetic resonance systems, which keep the HF amplitude constant, restrict the bandwidth. The real-time regulators may have a very restricted bandwidth on the order of 100 kHz, for example, due to the signal processing time. The real time regulators may be embodied as digital.

While this typical 100 kHz bandwidth of the regulators is sufficient to produce amplitude-modulated HF pulses with bandwidths in the region of several kHz without distortion during standard magnetic resonance imaging, the cited regulator bandwidth is much too low for the example cited. Either this prevents the use of a regulator, or the maximum gradient amplitude when the k-space is traversed during transmission is to be restricted. The HF pulse is thus lengthened over the entire period.

SUMMARY AND DESCRIPTION

The present embodiments may obviate one or more of the drawbacks or limitations in the related art. For example, a method for activating a magnetic resonance system and a corresponding controller, with which high frequency (HF) pulses with a larger bandwidth may be produced without the bandwidth of the regulator acting in a restricting manner, are provided.

The method serves to activate a magnetic resonance system. The magnetic resonance system includes a transmit antenna arrangement including a plurality of independent high-frequency transmit channels with a respectively assigned transmit antenna. Each high-frequency transmit channel includes, for example, a controllable oscillator. The individual high-frequency transmit channels are activated with independent transmit pulses. The frequencies of the controllable oscillators are also controlled independently. Such control provides that at least two of the controllable oscillators oscillate in different frequencies.

In magnetic resonance systems, planned HF pulses or pulse trains are first supplied in digital form in a base band and fed into an HF transmit system (e.g., HF transmit device). For the desired excitation of the hydrogen atoms, the HF pulses have the Larmor frequency. For 3-Tesla systems, this Larmor frequency is around 123 MHz. The Larmor frequency is supplied by an oscillator. The desired HF pulse or pulse train in the base band is combined with this oscillator frequency. This defines the bandwidth of the high-frequency pulse in the base band. The oscillators, with the frequency of which the base band signal is combined, are controlled individually.

This provides that an appropriate selection of oscillator frequencies allows at least some of the bandwidth requirement to be met by different oscillator frequencies.

In one embodiment, a control system (e.g., a control device or a controller) for activating a magnetic resonance system is provided. The controller is suitable for activating a magnetic resonance system that has a plurality of independent high-frequency transmit channels with a respectively assigned transmit antenna. Each high-frequency transmit channel has a controllable oscillator. The controller is also configured to activate the individual high-frequency transmit channels with independent transmit pulses. The transmit pulse of each individual channel may therefore have a different envelope curve. The amplitude and frequency spectra of the transmit pulses may be different. The transmit pulses are combined in each individual high-frequency transmit channel with the respective oscillator frequency. The frequencies of the controllable oscillators are to be activated independently, so that at least two of the controllable oscillators oscillate in different frequencies. This allows a further degree of freedom to be achieved in the design of HF pulses. The envelope curves of the HF pulses may therefore be individualized for each transmit channel not only via the transmit pulses but also via the combined frequency.

A magnetic resonance system or such a magnetic resonance unit includes, in addition to a basic field magnet system that may be used to apply a basic magnetic field in the patient measuring chamber, a transmit antenna system as mentioned above with a number of independent high-frequency transmit channels and a gradient system including a number of gradient coils and a local coil arrangement. The magnetic resonance system also includes one embodiment of a controller, as described above.

According to one embodiment, a multichannel pulse train with a number of individual HF pulse trains, to be emitted from a magnetic resonance system via different, independent high-frequency transmit channels, is provided. The HF pulse trains include information about a complex transmit amplitude in the base band and information about an oscillator frequency to be used for the individual high-frequency transmit channels. This oscillator frequency to be used is individual to each individual transmit channel. The complex transmit amplitude may be bandwidth-reduced, as one frequency component may be provided by the oscillator.

The majority of the abovementioned components of the controller may be implemented entirely or partially in the form of software modules in a processor of a corresponding controller. This is advantageous in that already existing controller may be retrofitted to perform the method using a software installation. A computer program product that may be stored in a non-transitory computer-readable medium and may be loaded directly into a processor of a programmable controller of a medical imaging unit (e.g., a magnetic resonance unit) with program code for executing all the acts of the method when the program is executed in the controller is thus also provided.

Advantageous embodiments are provided in the description that follows. The description of one category (e.g., the method) may be developed in the same way as the description of a different category (e.g., the apparatus).

In one embodiment, at least one of the controllable oscillators is controlled such that the frequency during a transmit pulse changes over time. Time-dependent frequency control allows better matching of the complex transmit amplitude in the base band and the frequency combined therewith. Time-dependent frequency control increases flexibility, thereby allowing better bandwidth lowering. The ability of the frequency to change over time may be expressed by:

$$B^1{}_{1ORG}(t) = B^i{}_1(t) \cdot \mathrm{Exp}(i \cdot \omega^i(t) \cdot t) \qquad (5)$$

The front factor $B^i_1(t)$ is the bandwidth-reduced base band signal, and the time-dependent frequency $\omega^i_1(t)$ is output from the oscillator together with the Larmor frequency $\omega_0$ and modulated onto the base band signal. The Larmor frequency $\omega_0$ may be determined precisely for every individual examination.

In one embodiment, the transmit pulses calculated for a predefined target magnetization with the magnetic resonance system are transformed to a complex transmit pulse amplitude component and a frequency-modulating component. The frequency-modulating component is taken into account in the activation of the controllable oscillators.

In one embodiment, a frequency component is transferred from the base band signal to the oscillator. The base band signal may thus have a smaller frequency bandwidth. For example, the frequency bandwidth of the base band signal may thus be reduced to below the permissible bandwidth for the regulator. However, no information is lost with such a bandwidth restriction, as the restriction is absorbed by the individual activation of the oscillator. Different antennae of a transmit antenna array may cover bandwidth subregions of a required overall bandwidth using different oscillator frequencies.

For example, $B^i_{1ORG}(t)$ is defined as the complex transmit amplitude to be emitted in the base band. This complex transmit amplitude may have too high a bandwidth for the regulator used or for another band-restricting component in the base band. In one embodiment, the complex transmit amplitude is transformed to $B^i_1(t)\cdot\mathrm{Exp}(i\cdot\omega^i\cdot t)$. Here, i designates the ith transmit channel of the transmit array. Therefore:

$$B^i_{1ORG}(t)=B^i_1(t)\cdot\mathrm{Exp}(i\cdot\omega^i\cdot t). \quad (6)$$

The remaining complex transmit amplitude $B^i_1(t)$ has a much reduced overall width compared with the originally calculated complex transmit amplitude. The frequency component $\omega^i$ is combined therewith via the oscillator. Each transmit antenna may cover, for example, a different spatial region, and the frequencies $\omega^i$ of the different oscillators of the i high-frequency transmit channels may differ from one another by a fixed amount.

Either the controller performs a transformation of the originally determined complex transmit pulses to bandwidth-reduced transmit pulses, or a higher-order control unit or a stored calculation program performs the conversion.

In one embodiment, the different transmit antennae of the transmit array irradiate different spatial regions. The desired time-dependency of the frequency is calculated from the time-dependency of a current gradient vector multiplied by a vector marking a mean value of the respective spatial region to be irradiated. The mean value of the respective spatial region to be irradiated may be determined in different ways. For example, the average may be taken. Other methods, which, for example, take account of the transmit characteristics of the transmit antenna, may be used. The time-dependent oscillator frequency of a transmit channel i may thus be calculated as:

$$\omega^i(t)=\gamma\cdot r^i\bullet G(t) \quad (7)$$

Here, $\omega^i(t)$ designates the oscillator frequency of the transmit channel i as a function of time,
$\gamma$=the gyromagnetic ratio,
$r^i$ designates the mean sensitive location in the form of a vector,
G(t) designates the current gradient vector as a function of time, and • expresses that this is a vector product.

As the number of transmit channels increases (e.g., also when the transmit antenna array (TX array) is segmented in the in z-direction), an increasingly spatially restricted irradiated region results for each individual transmit channel. For the channel i, the restricted irradiated region may extend over an interval $\Delta r^i$ around the mean sensitive location $r^i$. $\Delta r^i$ may be smaller than the overall desired excitation volume or refocusing volume or active volume. According to the above, a reduced bandwidth $\Delta\omega^i(t)$, where $$\Delta\omega^1(t)=\gamma\cdot\Delta r^i G(t) \quad (8)$$

is used to excite this restricted region $\Delta r^i$. A reduced bandwidth of the channel-specific HF pulse is implicitly associated with a reduction in the specific absorption rate SAR. For each transmit channel, only the spectral HF pulse components that actually have an active magnetic resonance influence are used.

In one exemplary embodiment, the controller is configured such that the frequency of at least one of the controllable oscillators may be controlled as a function of time during a pulse. Frequency components that were contained in the transmit pulse may be transferred to the frequency controller of the oscillator. A desired overall bandwidth may also be divided into a number of individual reduced bandwidths for each channel. In other words, the phase profile over time of each individual transmit channel is also included.

It is known from the prior art that the transverse magnetization may be calculated as $$m_{xy}(\vec{r}) = i\cdot\gamma\cdot m_0 \cdot \sum_{i=1}^{C} S^i(\vec{r}) \cdot \int_0^T B_1^i(t) e^{i\vec{r}\vec{k}(t)}\,dt \quad (9)$$

Here, $m_{xy}$ designates the transverse magnetization.
$m_0$ designates the longitudinal equilibrium magnetization.
$B^i$ designates the magnetic field of the high frequency for each channel i.
$\vec{r}$ designates the spatial pixel position.
$\vec{k}(t)$ designates the excitation trajectory in the k-space defined by $\vec{k}(t)=\int_0^1 \vec{G}(t')dt'$.
T designates the pulse length.
C designates the number of independent channels, with typical numbers for C being 1, 2, 8 and 16.
$S^i$ designates the sensitivity profile or $B_1$ map for each channel.

The phase profile over time based on the above frequency profiles comes out as:

$$\Phi^i(t) = \int_0^1 dt'\omega^i(t') \quad (10)$$

With this additional phase trajectory, an equation system that includes $B_1^{i(t)}$ results:

$$m_{xy}(\vec{r}) = i\gamma m_0 \sum_{c=1}^{C} S^i(\vec{r})\int_0^T B_1^i(t)\cdot e^{i(\vec{r}\vec{k}(t))}e^{j\phi^i(t)}\cdot dt \quad (11)$$

If the frequency or phase trajectory selected is appropriate (e.g., with a time-dependent frequency profile that is calculated as set out above as a vector product from the sensitive location and the current gradient vector), pulse shapes $B_1^i(t)$ that have a smaller bandwidth in the base band for the same transverse magnetization $m_{xy}$ may be determined.

BRIEF DESCRIPTION OF THE DRAWINGS

The same components are shown with the same reference characters in the various figures, in which.

DETAILED DESCRIPTION

Figure 1:
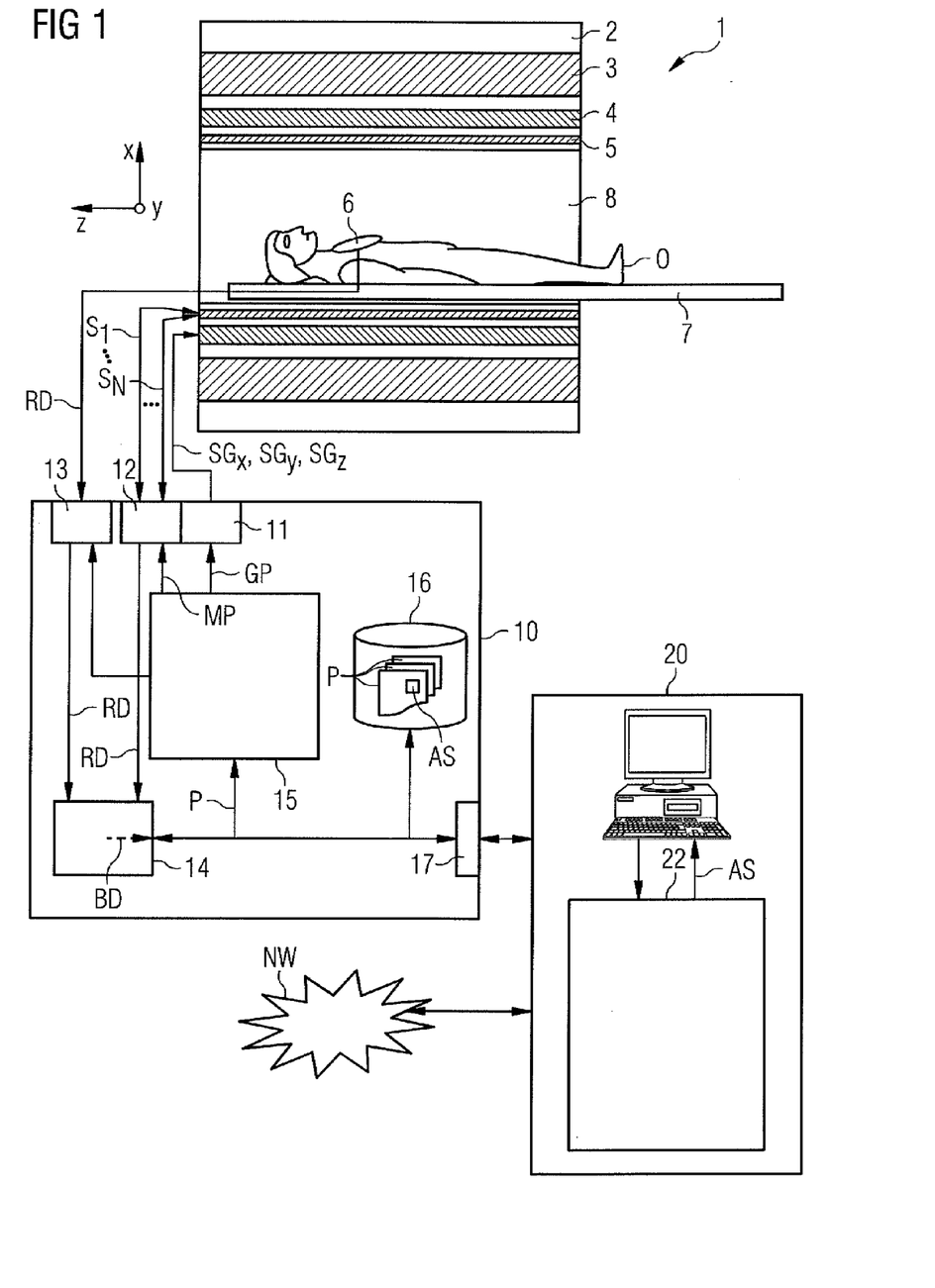
FIG. 1 shows a schematic diagram of an exemplary embodiment of a magnetic resonance unit.

FIG. 1 shows a schematic diagram of one embodiment of a magnetic resonance unit or magnetic resonance system 1. The magnetic resonance system 1 includes an actual magnetic resonance scanner 2 with an examination chamber or patient tunnel 8 located in the actual magnetic scanner 2. A couch 7 may be moved into the patient tunnel 8, so that a patient O or subject lying on the couch 7 may be supported during an examination in a specific position within the magnetic resonance scanner 2 relative to the magnet system and high-frequency system disposed in the magnetic resonance scanner 2 or may be moved between different positions during a measurement.

Components of the magnetic resonance scanner 2 are, for example, a basic field magnet 3, a gradient system 4 with magnetic field gradient coils to apply any magnetic field gradients in the x, y and z-directions, and a whole body high-frequency coil 5. Magnetic resonance signals induced in an examination object O may be received via the whole body coil 5, which may also be used to emit the high-frequency signals to induce the magnetic resonance signals. The signals may be received using local coils 6 positioned, for example, on or below the examination object O. All these components are known to the person skilled in the art and are therefore only shown highly schematically in FIG. 1.

The whole body high-frequency coil 5 has, for example, the structure of a birdcage antenna and has a number N of individual antenna rods that run parallel to the patient tunnel 8 and are disposed in a regularly distributed manner around a periphery of the patient tunnel 8. The individual antenna rods are connected capacitively to one another in a ring shape at one end.

The antenna rods may be activated separately as individual transmit channels $S_1, \ldots, S_N$ by a control system 10 (e.g., a controller). The controller 10 may be a control computer that may also include a plurality of individual computers (e.g., spatially separated and connected together via suitable cables or the like). A terminal interface 17 connects the controller 10 to a terminal 20, via which an operator may activate the magnetic resonance system 1 as a whole. The terminal 20 is equipped in the manner of a computer with a keyboard, one or more screens and further input devices (e.g., a mouse or the like), so that a graphical user interface is available to the operator.

The controller 10 has, for example, a gradient control unit 11 that may include a number of subcomponents. This gradient control unit 11 applies gradient control signals $SG_x$, $SG_y$, $SG_z$ to the individual gradient coils. The gradient control signals are gradient pulses that are to be directed to precisely specified temporal positions and with a precisely predefined time profile during a measurement.

The controller 10 also has a high-frequency (HF) transmit/receive unit 12. The HF transmit/receive unit 12 also includes a number of subcomponents to emit high-frequency pulses separately and in a parallel manner to each of the individual transmit channels $S_1, \ldots S_N$ (e.g., to the individually activatable antenna rods of the body coil). Magnetic resonance signals may also be received via the transmit/receive unit 12, but this may be done with the aid of the local coils 6. Raw data RD received using the local coils 6 is read out and processed by an HF receive unit 13. The magnetic resonance signals received by this or by the whole body coil using the HF transmit/receive unit 12 are transferred as raw data RD to a reconstruction unit 14 that uses the raw data RD to reconstruct image data BD and stores the image data BD in a storage unit 16 and/or transfers the image data BD via the interface 17 to the terminal 20, so that the operator may view the image data BD. The image data BD may also be stored and/or displayed and analyzed in other places via a network NW.

The gradient control unit 11, the HF transmit/receive unit 12 and the receive unit 13 for the local coils 6 are activated, respectively, in a coordinated manner by a measurement control unit 15. This provides, by corresponding commands, that a desired gradient pulse GP is emitted by appropriate gradient control signals $SG_x$, $SG_y$, $SG_z$ and activates the HF transmit/receive unit 12 in a parallel manner so that one or more multichannel pulses MP (e.g., a multichannel pulse train including one or more multichannel pulses MP) is emitted. The appropriate high-frequency pulses are output to the individual transmit rods of the whole body coil 5 in a parallel manner on the individual transmit channels $S_1, \ldots S_N$. At the appropriate time, the magnetic resonance signals at the local coils 6 are to be read out and further processed by the HF receive unit 13, or any signals at the whole body coil 5 are read out and further processed by the HF transmit/receive unit 12. The measurement control unit 15 predefines the corresponding signals (e.g., the multichannel pulses MP for the high-frequency transmit/receive unit 12 and the gradient pulses GP for the gradient control unit 11) according to a predetermined control protocol P. Stored in this control protocol P is all the control data that is to be set during a measurement.

In one embodiment, a plurality of control protocols P for different measurements is stored in a storage unit 16. These may be selected by the operator via the terminal 20 and changed, if required, in order to have an appropriate control protocol P available for the currently desired measurement, with which the measurement control unit 15 may work. The operator may also call up control protocols P, for example, from a manufacturer of the magnetic resonance system 1 via a network NW, and modify and use the control protocols P, as required.

The underlying sequence of such a magnetic resonance measurement and the cited components for activation are known to the person skilled in the art, so the underlying sequence and the cited components for activation are not discussed in more detail. Such a magnetic resonance scanner 2 and the associated controller 10 may also have a plurality of further components that are also not described in more detail.

The magnetic resonance scanner 2 may also be structured differently, for example, with a patient chamber that is open at the side, and the high-frequency whole body coil may not have the structure of a birdcage antenna. In one embodiment, an antenna that is additionally divided, if required, into individual antennae in the z-direction (e.g., along the length of the subject's body) is provided.

The transmit antenna has a number of separately activatable transmit channels $S_1, \ldots, S_N$, and therefore, a corresponding number of channel controllers are available in the controller 10 due to the high-frequency transmit/receive device, in order to be able to activate the individual transmit channels $S_1, \ldots, S_N$ separately. The separate activation also relates to the individual activation of the oscillators (not shown in FIG. 1).

FIG. 1 also shows a schematic diagram of a control sequence determination system 22 (e.g., a control sequence determination device) that serves to determine a magnetic resonance system activation sequence AS. The control sequence determination device 22 is shown as part of the terminal 20 and may be implemented in the form of software components on the computer of the terminal 20. Such a magnetic resonance system activation sequence AS includes both information about the multichannel pulse trains and information about the gradient pulses to be emitted in a coordinated manner and about the read-out window when magnetic resonance signals are to be read out for a measurement. Such a magnetic resonance system activation sequence AS may be integrated, for example, in a protocol P for the relevant measurement.

Figure 2:
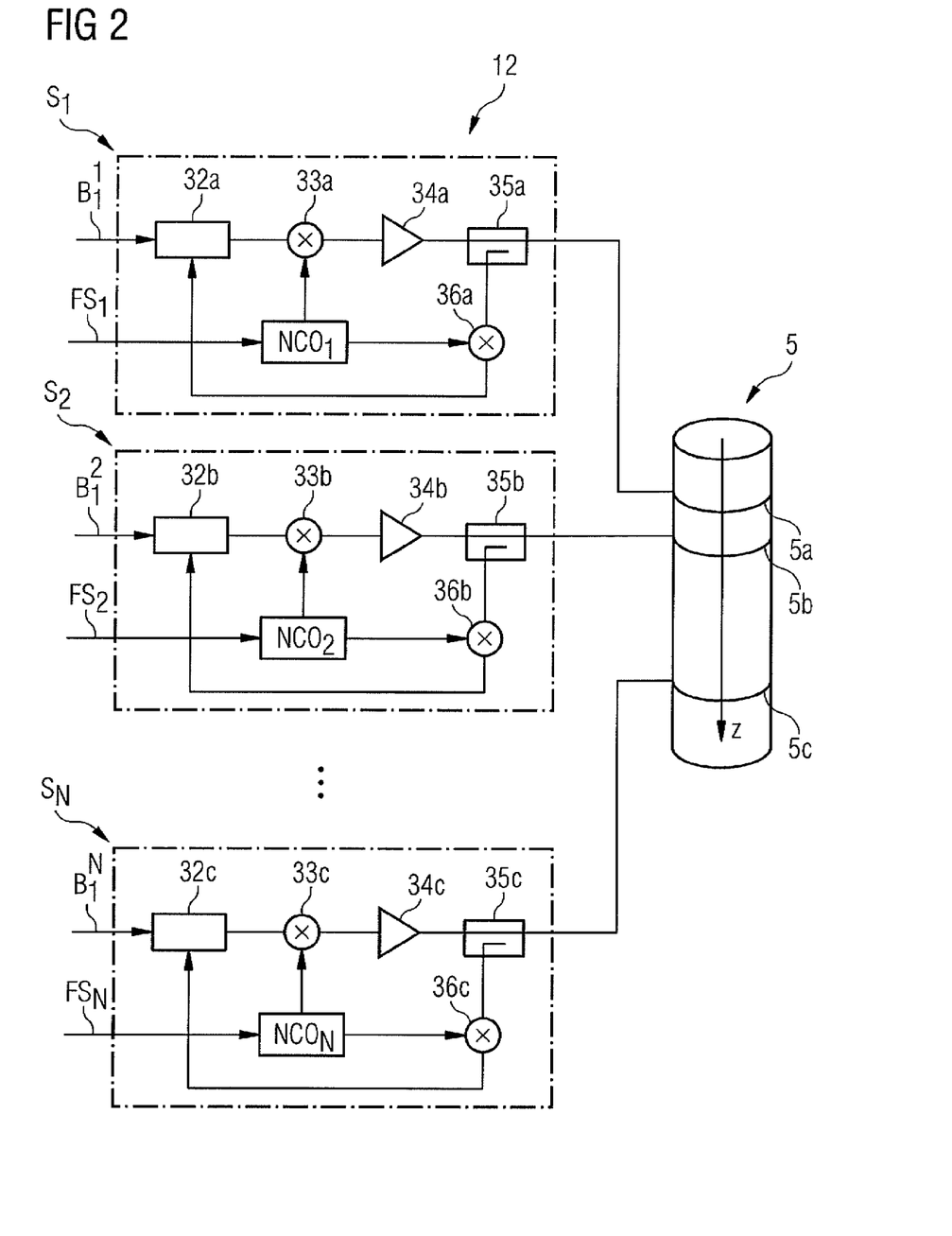
FIG. 2 shows a schematic diagram of an exemplary embodiment of a number of independent high-frequency transmit channels.

FIG. 2 shows a schematic diagram of an exemplary structure of a high-frequency transmit unit 12 with a number of transmit channels $S_1, S_2$ to $S_N$. The transmit channels $S_1, S_2$ to $S_N$ all have the same structure, so only the transmit channel $S_1$ will be described in detail. The individual high-frequency transmit channels $S_1, S_2$ to $S_N$ are each connected to an individual transmit antenna 5a, 5b, 5c. These transmit antennae or transmit coils 5a, 5b, 5c are parts of a TX array that together forms a whole body high-frequency coil of a magnetic resonance tomography system. In the embodiment in FIG. 2, this whole body high-frequency coil is essentially cylindrical with a center axis along the z-direction. The individual spatial regions irradiated by the transmit coils 5a, 5b and 5c therefore adjoin one another in the manner of disks in the z-direction.

Other embodiments may also be provided. Thus, in a conventional birdcage antenna, separation into individual segments may take place in the peripheral direction. The regions irradiated by the individual transmit antennae of the individual high-frequency transmit channels are then essentially "slices of cake" (e.g., circle segments of a certain thickness). Even if the further embodiments are always based on a disk-type division in the z-direction, this should not be restrictive.

In FIG. 2, the transmit channel $S_1$ is connected to the high-frequency coil 5a, the high-frequency transmit channel $S_2$ is connected to the high-frequency coil 5b as a transmit antenna, and the transmit channel $S_N$ is connected to a transmit coil 5c. Further high-frequency transmit channels with assigned transmit antennae may be disposed in between. The usual numbers of high-frequency transmit channels with assigned transmit antennae are 2, 4, 8 or 16. Another number of antennae may also be provided.

High-frequency channel $S_1$ includes a regulator 32a, a mixer 33a, an amplifier 34a and a directional coupler 35a. A controllable oscillator $NCO_1$ is also provided. The controllable oscillator $NCO_1$ may be a digital, controllable oscillator (e.g., a numerically controlled oscillator (NCO)). The oscillator frequency is output to the mixer 33a and to a further mixer 36a.

The regulator 32a, which may be embodied as a digital regulator, receives a transmit pulse $B_1^i$ at an input. This transmit pulse is matched to the specific examination task. The transmit pulse predefines an envelope curve of the high-frequency signal to be emitted. For short measuring cycles, the HF pulse and therefore also the transmit pulse $B_1^i$ may be as short as possible. The transmit bandwidth $f_{BW}$ to be provided is calculated, for example, from the gradient G that is active during transmission and the extension of the object D, on which the desired magnetization is to be stamped. The regulator 32a is provided to compensate for changes to the HF pulse on the high-frequency link, as produced, for example, by attenuation, reflection and the like.

The regulator 32a forwards the regulated transmit pulse to the mixer 33a. In the mixer 33a, the transmit pulse B is combined with the high-frequency supplied by the oscillator $NCO_1$, converted from digital to analog and output to the amplifier 34a. In the amplifier 34a, the high-frequency pulse signal is amplified and output via the directional coupler 35a to the assigned transmit antenna 5a. In the directional coupler 35a, the reflected transmit signal is decoupled and routed to the mixer 36a. FIG. 2 only shows a decoupling of the reflected signal. In one embodiment, both a component of the signal output by the amplifier in the outward direction and some of the reflected output may be decoupled. Both components together allow more information to be provided about the influences on the transmit link. In the mixer 36a, the decoupled signal is mixed back down into the base band with the signal from the oscillator $NCO_1$. Digitization of the signal also takes place here (not shown in FIG. 2). The digitized fed back signal is fed to the regulator 32a. This matches the originally fed in transmit pulse signal $B_1^1$ to the influences on the high-frequency link, and the signal is regulated.

Not only the transmit pulse $B_1^1$ (e.g., the envelope curve information) is fed into the high-frequency transmit channel, but also a frequency control signal $FS_1$ that is fed into the controllable oscillator $NCO_1$. Because of the signal processing to be provided, the real time regulator 32a has a restricted bandwidth that is on the order of 100 kHz, for example. The transmit bandwidth to be provided for a high gradient amplitude may, however, be around 850 kHz. In the illustrated embodiment, therefore, the first determined signal $B_{1ORG}^1(t)$ (not shown in FIG. 2) is broken down into a remaining transmit pulse $B_1^1(t)$ multiplied by a pure frequency-modulating channel-specific component $\omega^1(t)$:

$$B_{1ORG}^1(t) = B_1^1(t) \cdot \exp(i\omega^1 \cdot t) \tag{12}$$

The frequency control signal $FS_1$ therefore includes the frequency $\omega^1$ additively. The channel-specific frequency component is added to the base frequency of the oscillator resulting from the examination situation (e.g., the Larmor frequency).

High-frequency transmit channel $S_2$ is structured in the same way as high-frequency transmit channel $S_1$, including a regulator 32b, a mixer 33b, an amplifier 34b, a directional coupler 35b, a further mixer 36b and a controllable oscillator $NCO_2$. The regulator 32b receives a transmit pulse signal $B_1^2$, while the oscillator $NCO_2$ receives a frequency control signal $FS_2$.

Correspondingly, the high-frequency transmit channel $S_N$ has a regulator 32c, mixer 33c and 36c, an amplifier 34c, a directional coupler 35c and a controllable oscillator $NCO_N$. A transmit pulse $B_1^N$ is fed into the regulator, while a frequency control signal $FS_N$ is fed into the oscillator $NCO_N$.

Both the transmit pulse signals $B_1^1, B_1^2, B_1^N$ and also the frequency control signals $FS_1, FS_2, FS_N$ are independent of one another. This allows individual high-frequency pulses to be sent to the transmit coils 5a, 5b and 5c. The individual high-frequency pulses are optimal for the respective measuring task. For example, the design of the transmit pulses $B_1^1$, $B_1^2$ and $B_1^N$ is not restricted by the frequency bandwidth of the regulators 32a, 32b and 32c. If the proposed transmit pulses result in a required bandwidth that is higher than that provided by the regulator 32a, 32b and 32c, the transmit pulses are split into one component with reduced bandwidth and one purely frequency-modulating channel-specific component that may be different for each transmit channel. The channel-specific component may, for example, have a time dependency. The individual activation of the controllable oscillators thus allows more options when designing the high-frequency pulses. One possible application resulting from the individual activatability of the oscillators is described in more detail below with reference to FIG. 3.

Figure 3:
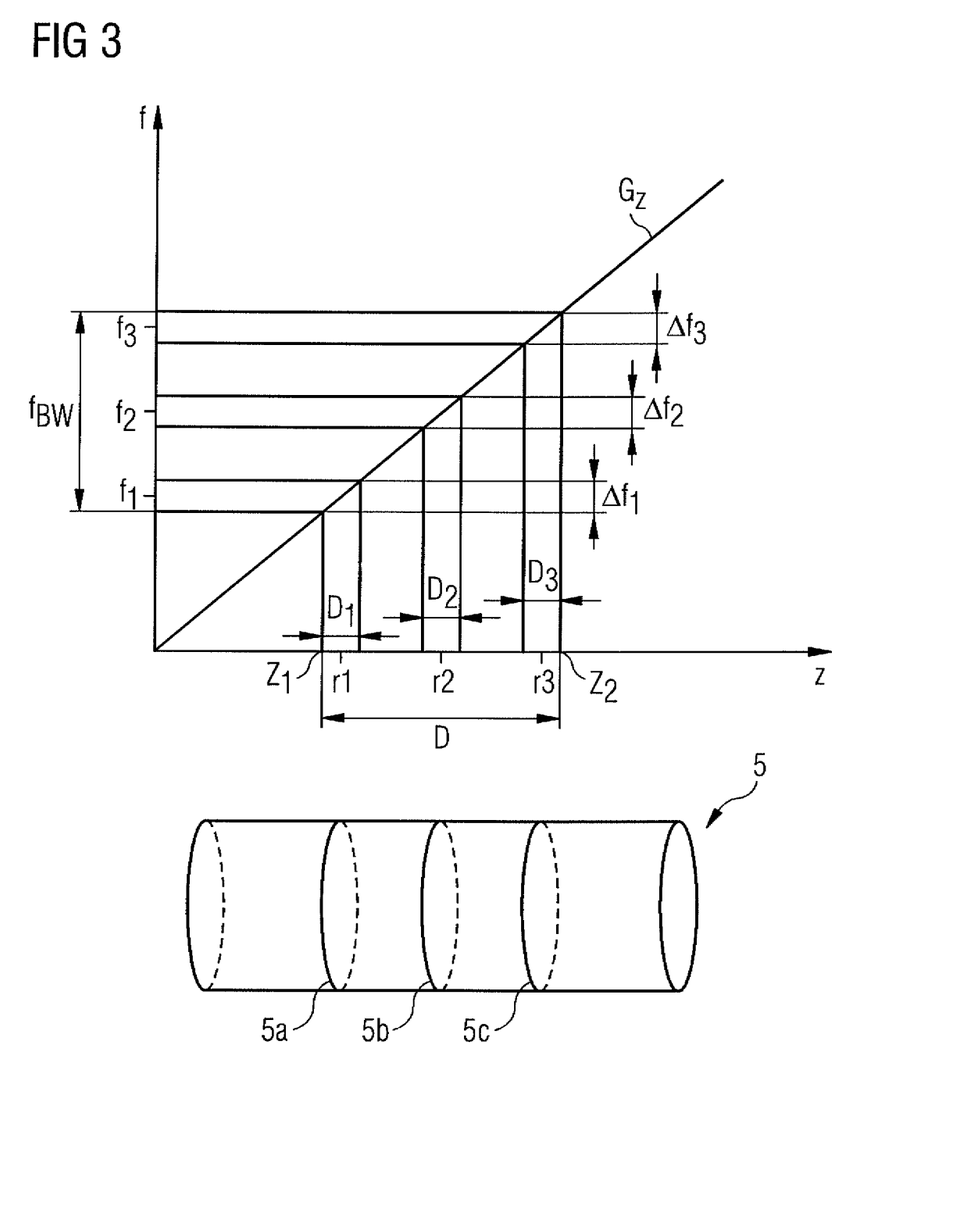
FIG. 3 shows a schematic diagram of an exemplary relationship between a local arrangement of individual transmit antennae, frequency bandwidth, and gradient profile.

FIG. 3 shows a graph of the relationship of frequency f and a spatial coordinate z. The spatial coordinate z is plotted in arbitrary units along the x-axis, while the frequency f is plotted, also in arbitrary units, along the y-axis. A gradient field in the z-direction allows spatial resolution to be achieved along the z-axis. In other words, the frequency changes along the z-axis. For example, a slice thickness D is to be traversed (e.g., the spins in a layer thickness D are to be detected by an HF pulse). With the illustrated gradient $G_z$, the exciting HF pulse is to have a bandwidth of $f_{BW}$. The bandwidth $f_{BW}$ results from the graphic representation in FIG. 3 over the section of the spatial coordinates $z_1$ and $z_2$ delimiting the slice thickness D with the gradient profile G.

As illustrated schematically in FIG. 3, in one embodiment, the spatial distribution of the transmit antennae of the TX array 5a, 5b and 5c is used to assign a smaller frequency bandwidth to each individual antennae. Each individual transmit antenna transmits, for example, with a different mean frequency $f_1$, $f_2$, $f_3$, that is achieved by corresponding activation of the oscillators. Therefore, according to FIG. 3, the antenna 5a covers the spatial subregion $D_1$. The HF pulses emitted by the antenna 5a have a mean frequency $f_1$ for this, with a bandwidth $\Delta f_1$. The antenna 5b covers the spatial subregion $D_2$ with a mean frequency $f_2$ and a bandwidth of $\Delta f_2$, while the antenna 5c correspondingly covers the spatial subregion $D_3$ with $f_3$ as the mean frequency and a bandwidth of $\Delta f_3$. FIG. 3 shows a distance between the individual covered regions $D_1$, $D_2$ and $D_3$. The individual covered regions $D_1$, $D_2$ and $D_3$ may adjoin or even overlap one another. The individual activation of the individual oscillators in the different high-frequency transmit channels $S_1$, $S_2$, $S_N$ allows the region division set out above to be achieved.

The respective effective bandwidths are therefore significantly reduced. Overall, however, the entire region D is covered. $D_1$ may also be referred to as an interval $\Delta r^1$ around a mean sensitive location $r^1$. Accordingly, $D_2$ may be referred to as an interval $\Delta r^2$ around the mean sensitive location $r^2$.

The application of a gradient field brings about a spatially dependent distribution of the resonant frequency. In order to excite individual spins in a regionally selective manner, the resonant frequency may also be followed synchronously with the gradient field. With temporal activation of the respective oscillators of the individual high-frequency transmit channels, the frequency may be matched respectively to the gradient.

As shown in FIG. 3, each channel-specific high-frequency pulse has a reduced bandwidth $\Delta f$. This directly reduces the specific absorption rate SAR. Each transmit channel only uses the spectral HF pulse components that actually have an active influence.

The magnetic resonance system described in detail above is only an exemplary embodiment that may be modified by the person skilled in the art in many ways without departing from the scope of the invention. The use of the indefinite article "a" or "an" also does not exclude the possibility of the relevant features being present in a multiple fashion. Similarly, the terms "unit" and "module" do not exclude the possibility of the relevant components including a number of interacting subcomponents that may also be distributed spatially.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for activating a magnetic resonance system having a transmit antenna arrangement, the transmit antenna arrangement comprising a plurality of independent high-frequency transmit channels with a respectively assigned transmit antenna, each high-frequency transmit channel of the plurality of independent high-frequency transmit channels having a controllable oscillator, the method comprising:
    activating individual high-frequency transmit channels of the plurality of independent high-frequency transmit channels with independent transmit pulses;
    controlling a frequency of the controllable oscillators independently so that at least two of the controllable oscillators oscillate in different frequencies; and
    transforming the transmit pulses calculated for a predefined target magnetization with the magnetic resonance system to a complex transmit pulse amplitude component and a frequency-modulating component, the frequency-modulating component being taken into account in controlling the controllable oscillators.

2. The method as claimed in claim 1, wherein at least one of the controllable oscillators is controlled such that the frequency during a transmit pulse changes over time.

3. The method as claimed in claim 2, wherein the transmit antennae irradiate different spatial regions, and
    wherein a time-dependency of the frequency results from a time-dependency of a current gradient vector multiplied by a vector marking a mean value of the respective spatial region to be irradiated.

4. The method as claimed in claim 1, wherein the transmit antennae irradiate different spatial regions, and
    wherein a time-dependency of the frequency results from a time-dependency of a current gradient vector multiplied by a vector marking a mean value of the respective spatial region to be irradiated.

5. A control system for activating a magnetic resonance system having a plurality of independent high-frequency transmit channels with a respectively assigned transmit antenna, the control system comprising:
    a controllable oscillator for each high-frequency transmit channel of the plurality of independent high-frequency transmit channels; and
    a processor configured to:
        activate individual high-frequency transmit channels of the plurality of independent high-frequency transmit channels with independent transmit pulses;
        activate frequencies of the controllable oscillators independently, so that at least two of the controllable oscillators oscillate in different frequencies; and
        transform the transmit pulses into a complex transmit pulse amplitude component and a frequency-modulating component, the frequency-modulating component controlling the frequencies of the controllable oscillators.

6. The control system as claimed in claim 5, wherein the processor is further configured to activate the frequency of at least one of the controllable oscillators as a function of time during a pulse.

7. A magnetic resonance tomography system having a plurality of independent high-frequency transmit channels with a respectively assigned transmit antenna, each high-frequency transmit channel of the plurality of independent high-frequency transmit channels having a controllable oscillator, the magnetic resonance tomography system comprising:
  a control system configured to:
    activate individual high-frequency transmit channels of the plurality of independent high-frequency transmit channels with independent transmit pulses;
    control frequencies of the controllable oscillators independently, so that at least two of the controllable oscillators oscillate in different frequencies; and
    transform the transmit pulses calculated for a predefined target magnetization with the magnetic resonance system to a complex transmit pulse amplitude component and a frequency-modulating component, the frequency-modulating component being taken into account in controlling the controllable oscillators.

8. A magnetic resonance system comprising:
  different high-frequency transmit channels configured to emit a multichannel pulse train having a plurality of individual HF-pulse trains, the plurality of individual HF pulse trains containing information about a complex transmit amplitude and information about an oscillator frequency to be used for the different high-frequency transmit channels.

9. In a non-transitory computer-readable storage medium that stores instructions executable by a processor of a programmable control system of a medical imaging unit to activate a magnetic resonance system having a transmit antenna arrangement, the transmit antenna arrangement comprising a plurality of independent high-frequency transmit channels with a respectively assigned transmit antenna, each high-frequency transmit channel of the plurality of independent high-frequency transmit channels having a controllable oscillator, the instructions comprising:
  activating individual high-frequency transmit channels of the plurality of independent high-frequency transmit channels with independent transmit pulses;
  controlling a frequency of the controllable oscillators independently so that at least two of the controllable oscillators oscillate in different frequencies, and
  transforming transmit pulses calculated for a predefined target magnetization with the magnetic resonance system to a complex transmit pulse amplitude component and a frequency-modulating component, the frequency-modulating component being taken into account in activation of the controllable oscillators.

10. The method as claimed in claim 9, wherein at least one of the controllable oscillators is controlled such that the frequency during a transmit pulse changes over time.

* * * * *